United States Patent
Walker et al.

(10) Patent No.: US 11,545,524 B2
(45) Date of Patent: Jan. 3, 2023

(54) SELECTOR TRANSISTOR WITH CONTINUOUSLY VARIABLE CURRENT DRIVE

(71) Applicant: Integrated Silicon Solution, (Cayman) Inc., Grand Cayman (KY)

(72) Inventors: Andrew J. Walker, Mountain View, CA (US); Dafna Beery, Palo Alto, CA (US); Peter Cuevas, Los Gatos, CA (US); Amitay Levi, Cupertino, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 4 days.

(21) Appl. No.: 16/738,835

(22) Filed: Jan. 9, 2020

(65) Prior Publication Data
US 2021/0217814 A1    Jul. 15, 2021

(51) Int. Cl.
| | |
|---|---|
| H01L 27/24 | (2006.01) |
| H01L 29/66 | (2006.01) |
| H01L 29/78 | (2006.01) |
| H01L 27/22 | (2006.01) |

(52) U.S. Cl.
CPC ........ *H01L 27/2454* (2013.01); *H01L 27/228* (2013.01); *H01L 29/66666* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 2012/0146166 A1* | 6/2012 | Levi | H01L 43/08 257/E29.323 |
| 2013/0105876 A1* | 5/2013 | Hwang | H01L 27/2454 257/314 |
| 2016/0126381 A1* | 5/2016 | Wang | H01L 31/022408 257/429 |

OTHER PUBLICATIONS

Chung et al., "Novel 4F2 DRAM Cell with Vertical Pillar Transistor(VPT)," IEEE, 2011, pp. 211-214.
Fang et al., "Fully CMOS-Compatible 1T1R Integration of Vertical Nanopillar GAA Transistor and Oxide-Based RRAM Cell for High-Density Nonvolatile Memory Application," IEEE Transactions on Electron Devices, vol. 60, No. 3, Mar. 2013, pp. 1108-1113.
Ong et al., U.S. Appl. No. 16/457,544, filed Jun. 28, 2019.
Ong et al., U.S. Appl. No. 16/691,448, filed Nov. 21, 2019.
(Continued)

*Primary Examiner* — Steven M Christopher

(57) ABSTRACT

A magnetic memory structure that includes a two-terminal resistive memory element electrically connected with a selector structure. The selector structure includes a semiconductor pillar structure formed on a semiconductor substrate. The selector structure is surrounded by a gate dielectric layer, and the semiconductor pillar structure and gate dielectric layer are surrounded by an electrically conductive gate structure. The semiconductor pillar has first and second dimensions in a plane parallel with the surface of the semiconductor substrate that are unequal with one another. The semiconductor pillar structure can have a cross-section parallel with the semiconductor substrate surface that is in the shape of a: rectangle; oval elongated polygon, etc. The length of the longer dimension can be adjusted to provide a desired amount of current though the semiconductor pillar structure to drive the two-terminal resistive memory element.

19 Claims, 18 Drawing Sheets

(56) References Cited

OTHER PUBLICATIONS

Beery et al., U.S. Appl. No. 16/555,150, filed Aug. 29, 2019.
Beery et al., U.S. Appl. No. 16/685,873, filed Nov. 15, 2019.
Lisoni et al., "Laser Thermal Anneal of polysilicon channel to boost 3D memory performance," IEEE Symposium on VLSI Technology: Digest of Technical Papers, 2014, 2 pages, retrieved from https://ieeexplore.ieee.org/document/6894346.
Capogreco et al., "Integration and electrical evaluation of epitaxially grown Si and SiGe channels for vertical NAND Memory applications," IEEE 7th International Memory Workshop, 2015, 4 pages.

\* cited by examiner

SELECTOR TRANSISTOR WITH CONTINUOUSLY VARIABLE CURRENT DRIVE

FIELD OF THE INVENTION

The present invention relates to two terminal resistive memory and more particularly to a memory array employing a two terminal resistive memory element driven by a vertical selector channel having a structure configured to provide a variable current drive.

BACKGROUND

The ever-increasing demand for data storage has led a push for the development of new and improved memory structures. Traditionally data has been stored in an array of transistors which can be employed as switches to store data as a one (1) and zero (0) memory states. Ideally, data storage systems can operate quickly, at low energy consumption and can maintain stored data over a long period of time without compromise of data integrity. Recently, researchers have looked to memory storage employing memory cells other than pure transistor storage, such as through the use of two terminal resistive switches.

Various types of two terminal resistive switches can be used to store data. One type of two terminal resistive switching technology that can be used to store data is Magnetic Random-Access Memory (MRAM). Magnetic Random-Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of majority electrons in the free layer will be generally opposite to the majority spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as a "0", whereas the high resistance state can be read as a "1". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded data bit is non-volatile in that it remains intact in the absence of any electrical power.

The magnetic memory elements can be arranged in an array of memory elements that are connected with word lines and bit lines. A source-line can provide read and write currents to the memory elements, with the individual memory elements being selected by the word line and bit line. In addition to MRAM memory systems, other types of two terminal resistive switching elements can be used in a similar manner being connected with word and bit lines to both switch the memory state of the element and to read a memory state of the element.

SUMMARY

The present invention provides a three-dimensional transistor structure that includes a semiconductor substrate having a surface, and a semiconductor pillar structure formed on the semiconductor substrate. The semiconductor pillar has a first dimension parallel with the surface of the semiconductor substrate and a second dimension parallel with the semiconductor substrate, wherein the first and second dimensions are unequal with one another. A gate dielectric layer surrounds the semiconductor pillar structure, and an electrically conductive gate structure surrounds the semiconductor pillar structure and the gate dielectric layer.

The three-dimensional transistor structure can be a selector structure that is part of a memory cell structure. The memory cell structure can include a two-terminal resistive memory element that can be electrically connected with the semiconductor pillar structure. The two-terminal resistive memory element can be a magnetic tunnel junction element such as a perpendicular magnetic tunnel junction element, or can be another type of two terminal resistive memory element, such as: ReRAM; Correlated Electron RAM (CERAM); Conductive Bridge RAM (CBRAM); or memristor structures. ReRAM can be a resistive switch which can be based on metal filaments such as silver in amorphous silicon. Other types of ReRAM include metal filaments in chalcogenide materials. In addition ReRAM element can be constructed using HfO with a titanium buffer layer. Various forms of tantalum oxide have also been used as an insulator between two metal electrodes. ReRAM can also be based on transition metal oxides (TMO) such as perovskite manganites and titanates. Correlated Electron RAM (CERAM) can be based on transition metal oxides such as perovskite manganites and titanates. Conductive Bridge RAM (CBRAM) can be formed using materials such as silver-doped germanium selenide glasses and copper-doped germanium sulfide electrolytes. Another type of memory element is Phase Change Material (PCM) where a resistance change is effected by changing the morphology of a material form amorphous to crystalline and back again. PCM materials include compounds of Germanium, Antimony and Tellurium such as $Ge_2Sb_2Te_5$ (GST).

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
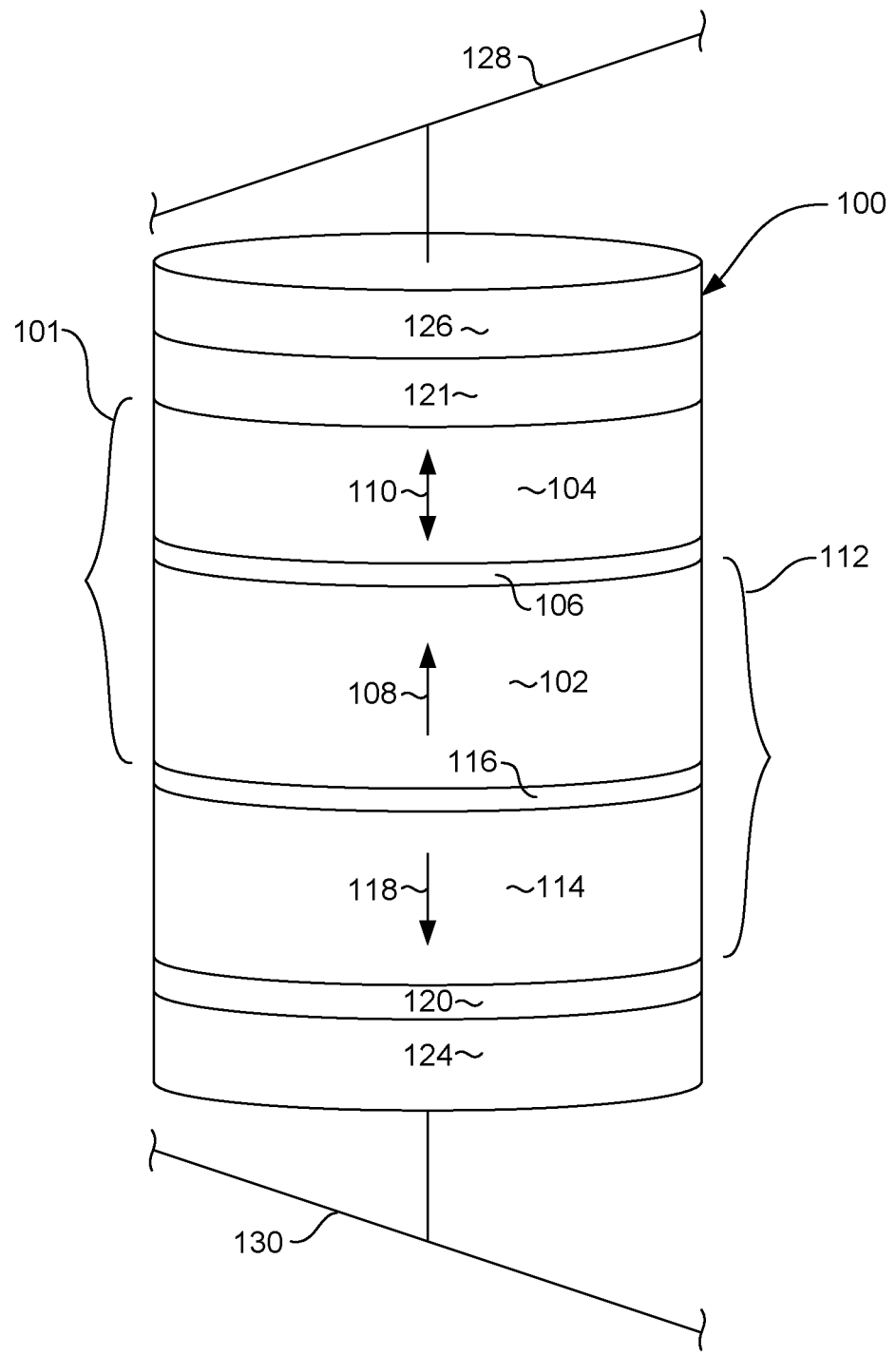
FIG. 1 is a schematic view of a perpendicular magnetic tunnel junction (pMTJ) element as an example of a two terminal resistive switching element that can be used in a memory array.

Referring now to FIG. 1, a magnetic memory element 100 can be in the form of a perpendicular magnetic tunnel junction (pMTJ) memory element, which is described as a specific example of a two terminal resistive switching element that can be used in various embodiments. The magnetic memory element can include an MTJ 101 that can include a magnetic reference layer 102, a magnetic free layer 104 and a thin, non-magnetic, electrically insulating barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer 104 has a magnetization 110 that can be in either of two directions perpendicular to the plane of the layer 104. While the magnetization 110 of the free layer 104 remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure such as a Synthetic Anti-Ferromagnet (SAF) 112 that can include a magnetic balancing bottom layer 114, and a non-magnetic, antiparallel coupling layer (such as Ru) 116 located between the bottom SAF layer 114 and reference layer 102. The antiparallel coupling layer 116, which will be described in greater detail herein below, can be constructed to have a composition and thickness such that it will couple the layers 114, 102 in an antiparallel configuration. The antiparallel coupling between the layers 114, 102 ensures that the magnetization 108 of the reference layer 102 is fixed in a direction opposite to the direction of magnetization 118 of the bottom SAF layer 114.

A seed layer 120 may be provided near the bottom of the memory element 100 to initiate a desired crystalline structure in the above deposited layers. A capping layer 121 may be provided near the top of the memory element 100 to protect the underlying layers during manufacture, such as during high temperature annealing and from exposure to ambient atmosphere. The capping layer 121 can be constructed of, for example, Ta.

In addition, electrodes 124, 126 may be provided at the bottom and top of the memory element 100. The electrodes 124, 126 may be constructed of a non-magnetic, electrically conductive material such as one or more of Ta, W, Cu and Al and can provide electrical connection a bit line 128 and a word line 130 for reading and writing data to the memory element 100.

The magnetic free layer 104 has a perpendicular magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to efficiently pass through the barrier layer 106 to the reference layer 102. As a result, the electrons having an opposite spin will be reflected at barrier layer 106, and return to the free layer 104 with a spin polarization opposite that of the reference layer 102. These spin polarized electrons cause a spin torque that causes the magnetization 110 of the free layer 104 to flip from an upward direction to a downward direction.

The magnetic memory element 100 can be electrically connected with a bit line 128 at one end and a word line 130 at the opposite end. An electrical current from the word and bit lines 128, 130 can be used to switch the memory state of the memory element 100 as described above, and can also be used to read an electrical resistance of the memory element during a read operation to determine whether the memory element 100 is in a high resistance state or a low resistance state (i.e. 0 or 1).

Figure 2:
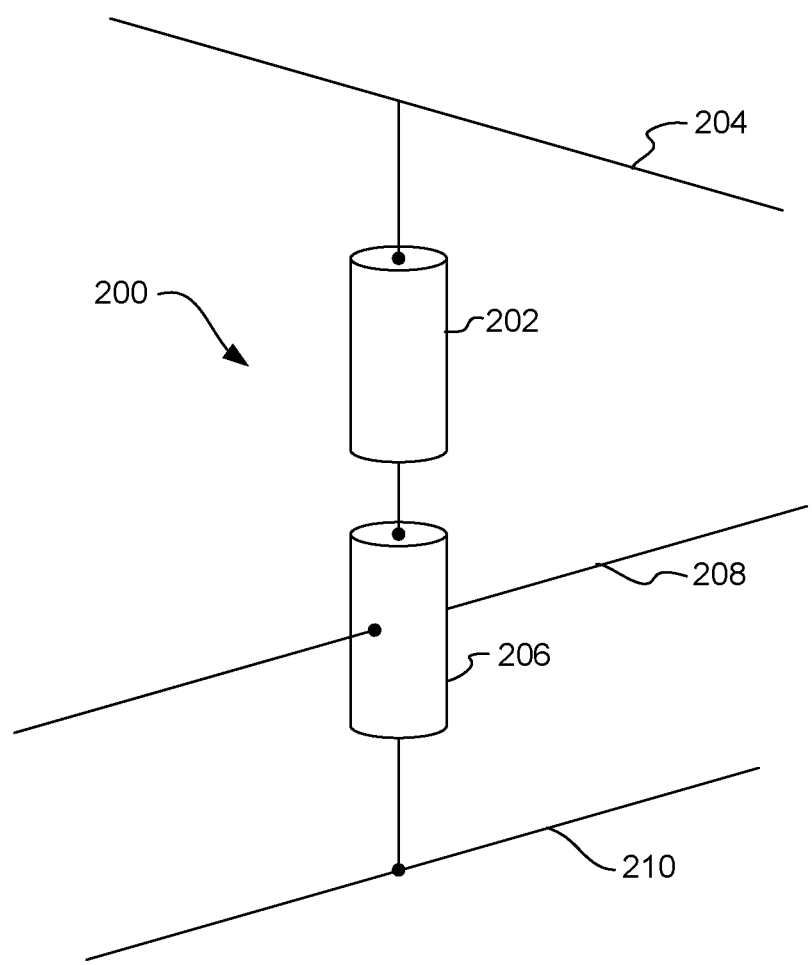
FIG. 2 is a schematic illustration of a two terminal resistive switching element connected with word and bit lines and connected with a source-line selector.

FIG. 2 is a schematic illustration of a memory cell 200 of a memory array. The memory cell 200 includes a two terminal resistive memory element 202. The two terminal resistive memory element 202 can be a magnetic tunnel junction (MTJ) element such as that described above with reference to FIG. 1, or could be some other type of two terminal resistive memory element such as, but not limited to: ReRAM; Correlated Electron RAM (CERAM); Conductive Bridge RAM (CBRAM); or memristor structures. ReRAM can be a resistive switch which can be based on metal filaments such as silver in amorphous silicon. Other types of ReRAM include metal filaments in chalcogenide materials. In addition, ReRAM element can be constructed using HfO with a titanium buffer layer. Various forms of tantalum oxide have also been used as an insulator between two metal electrodes. ReRAM can also be based on transition metal oxides (TMO) such as perovskite manganites and titanates. Correlated Electron RAM (CERAM) can be based on transition metal oxides such as perovskite manganites and titanates. Conductive Bridge RAM (CBRAM) can be formed using materials such as silver-doped germanium selenide glasses and copper-doped germanium sulfide electrolytes. Another type of memory element is Phase Change Material (PCM) where a resistance change is affected by changing the morphology of a material from amorphous to crystalline and back again. PCM materials include compounds of Germanium, Antimony and Tellurium such as $Ge_2Sb_2Te_5$ (GST).

The two terminal resistive memory element can be connected at one end to an electrically conductive bit line 204. The other end of the two terminal resistive memory element 202 can be connected with a selector 206. The selector 206 can be in the form of a vertical semiconductor transistor structure which will be described in greater detail herein below. The selector 206 is connected with a source line 210, which provides a source-line voltage to the selector 206. A word-line 208 is electrically connected with the selector 206 in such a manner as to supply a gate voltage to the selector 206. When the word-line 208 applies a voltage to the selector 206, the selector becomes conductive, allowing a current to flow from the source-line 210 to the memory element 202. When voltage at the word-line 208 is below the threshold voltage of the selector 206, the selector becomes highly resistive, thereby impeding the flow of current between the source-line 210 and the memory dement 202.

Memory systems employing two terminal resistive memory elements such as MTJ memory elements exhibit fundamentally different performance characteristics from more traditional memory systems that employ transistors as memory elements, such as in NAND architectures. In such more traditional transistor-based memory systems, the storage of electrical charge in a location between the transistor's gate and its channel changes the transistor's threshold voltage. The difference between a programmed and erased cell is sensed by measuring the transistor's source-drain current. Programming is done with high voltages but small currents. To get a large window between programmed and erased states, more charge can be stored but this is usually at the expense of other factors such as endurance and retention.

Memory systems based on two terminal memory elements such as MTJ elements, however, function in a fundamentally different manner. The memory element is either in a high resistance state or low resistance state, and the electrical resistance of the memory element is dictated by the magnetic orientations of the magnetizations of the magnetic layers in the memory element. As described above, this memory state is switched (written) by supplying an electrical current through the memory element 202 (e.g. between the source-line 210 and the bit line 204. The higher the current through the memory element 202 the higher the probability is that the memory state of the memory element 202 will be switched as desired. Therefore, increasing this current increases the accuracy of writing by increasing the number of memory elements that will be correctly switched. Ideally, 100% of the memory elements will be switched as desired, and to reach or come close to this performance ideal an increased electrical current between the source-line 210 and bit-line 204 is desired.

Accurately switching the memory state of the memory element 202 requires that a large electrical current be able to flow through the selector 206 to the memory element 202 when the selector is in an "on" state. This requirement for high current at low voltage shows a fundamental difference between such a system and the more traditional transistor-based systems such as NAND Flash where high voltages and low currents are used to store electrical charge. In a memory system such as that described above, the selector 206 requires high current flow in an "on" state to reliably switch the memory state 202 when desired. This need for increased current flow through the selector 206, therefore, requires a fundamentally different design and structure than with transistor-based memory systems. As a result, the formation of such a high current selector transistor fabricated in a manufacturable process has not been previously contemplated by those skilled in the art of memory arrays.

Figure 3:
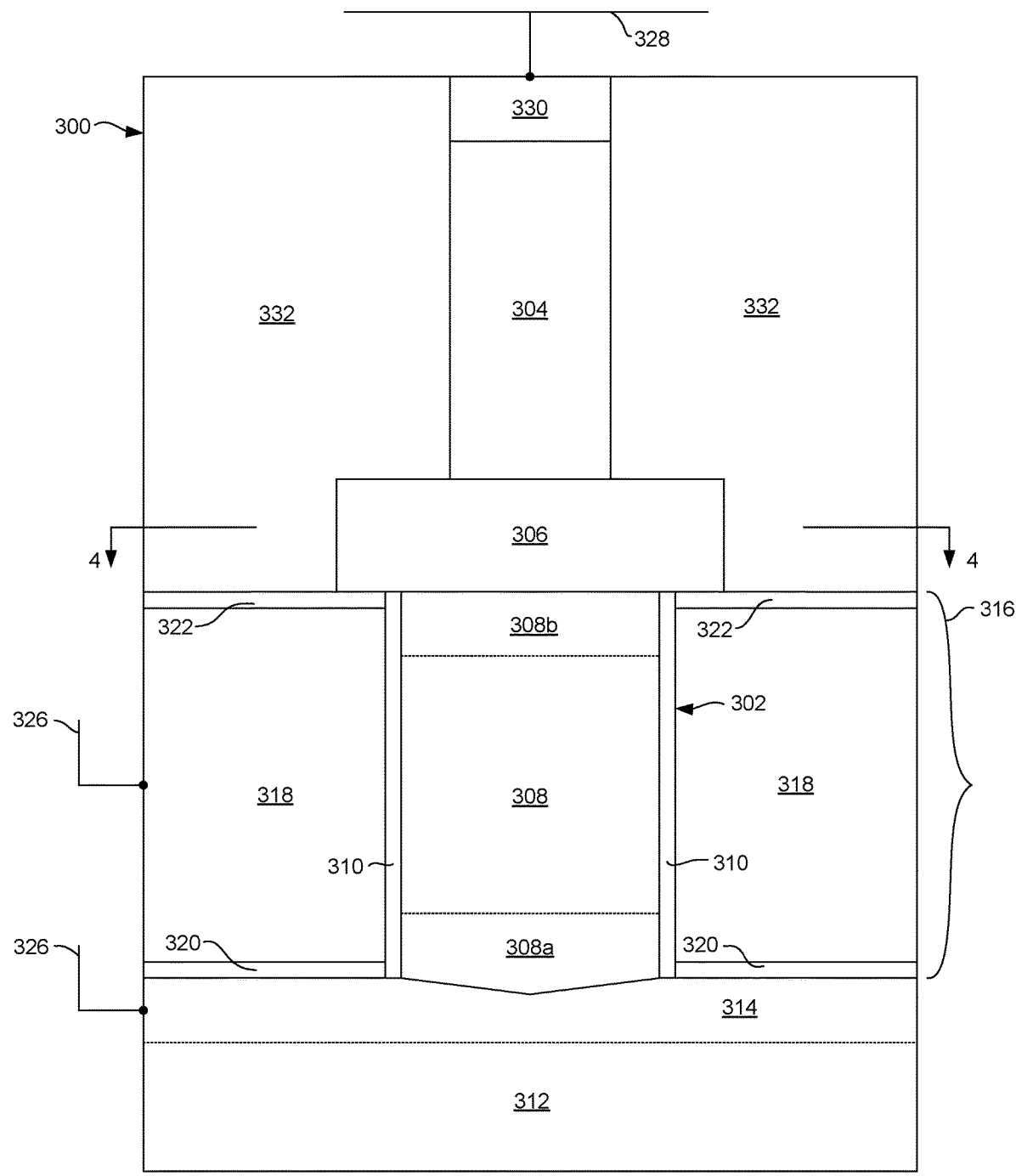
FIG. 3 is a cross sectional view of a memory cell according to an embodiment.

FIG. 3, shows a side, cross-sectional view of a memory cell 300 according to an embodiment. The memory cell includes a vertical transistor selector structure 302 and a memory element 304 that is electrically connected with the selector structure 302 by an electrode 306. The selector structure 302 includes a semiconductor column 308 surrounded at its outer side by a thin gate dielectric layer 310. The semiconductor column 308 can be a semiconductor material such as Si, SiGe, etc. and preferably formed by selective epitaxial growth on a semiconductor substrate 312, as will be described in greater detail herein below. The semiconductor column preferably has a structure that is monocrystalline or nearly monocrystalline, which can be achieved through the selective epitaxial growth. The semiconductor column 308 has doped regions 308a, 308b formed at opposite ends of the semiconductor column 308. The doped regions 308a, 308b can be, for example n+ or p+ doped regions formed by in-situ doping and can serve as source and drain regions. The region 308a can be formed through diffusion of the dopant that is in region 314. This dopant may have been introduced through implantation of the bulk wafer 312 before the semiconductor column 308 is formed. The region 308b can be formed through implantation after the semiconductor column 308 has been formed. It can also be formed through in-situ doping during the epitaxial growth used to form the semiconductor column 308. In-situ doping during epitaxial growth of the semiconductor column 308 can be used to dope regions 308a and 308b and also the rest of the semiconductor column 308. Regions 308a and 308b can be doped n-type using arsenic, phosphorus or antimony while the rest of the column 308 can be left undoped or can be doped either n-type or p-type. The p-type approach can use boron or gallium. Regions 308a and 308b can alternatively be doped p-type using either boron or gallium.

The gate dielectric layer 310 can be constructed of an oxide such as silicon oxide. The substrate 312, can have an upper portion 314 that is n+ doped and which functions as a source-line to deliver a source current to the semiconductor column 308. The n+ doped upper region 314 can be electrically connected with source-line circuitry 326. For p-type transistor selectors, region 314 can be doped p-type using either boron or gallium.

A gate/word-line structure 316 is formed at the sides of the selector structure 302. The gate/word-line structure 316 includes an electrically conductive gate layer 318 located between a first (lower) dielectric layer 320 and a second (upper) dielectric layer 322. The electrically conductive gate layer 318 can be connected with word-line circuitry to provide a gate voltage to the selector structure 302. When the electrically conductive gate layer 318 provides a gate voltage above the threshold voltage of the selector structure 302, the semiconductor column becomes electrically conductive so that it can supply a current to the memory element 304.

The memory element 304 can be any type of two terminal resistive memory element. For example, the memory element 304 could be a magnetic tunnel junction such as the perpendicular magnetic tunnel junction (pMTJ) 100 described above with reference to FIG. 1. The memory element 304 could also be some other type of two terminal resistive memory element, such as, but not limited to: ReRAM; Correlated Electron RAM (CERAM); Conductive Bridge RAM (CBRAM); or memristor structures. While one end of the two terminal resistive memory element 304 is connected to the selector structure 308 via the first electrode 306, the opposite end of the two terminal resistive memory element 304 can be connected with bit-line circuitry 328 via a second (upper) electrode 330. Areas surrounding the two terminal resistive memory element 304 and electrodes 306, 330 can be filled with a dielectric isolation material 332 such as an oxide or nitride.

Memory cell arrays employing two terminal resistive memory elements such as described above often require a selector transistor that can deliver a certain amount of current. This required current is often higher than would be required in more common transistor-based memory systems such as NAND memory. In general, in any field effect transistor the source-drain current is directly proportional to the total gate width of the transistor. In the case of a transistor where the channel has been formed through selective epitaxy such that the channel grows mostly in a monocrystalline form using the exposed substrate in an etched hole as an index, the gate needs to have the prime control of conduction between the source and drain. Experimental data has shown that cylindrical channels can have significant "source-to-drain" punch-through in the sub-threshold regime if the cylindrical diameter is large enough. Therefore, to maintain good gate control and have the ability of increasing the effective transistor width, a different geometry is needed. Drive current to a two terminal resistive memory element could be increased by using multiple selector structures connected with a single memory element. However, this would only allow the drive current to be increased in large incremental jumps and would also increase the area needed for the multiple selector structures, thereby decreasing data density.

In a vertical transistor structure employing a semiconductor structure formed by selective epitaxial growth as described above, the gate can maintain good conduction control and the source drain current can be increased by increasing the total perimeter of the channel while maintaining gate control. The present invention provides a selector geometry that can adjust the current drive through the selector structure to any desired level to effectively drive a two terminal resistive memory device. Furthermore, this can be accomplished while maintaining a basic selector structure width.

Figure 4:
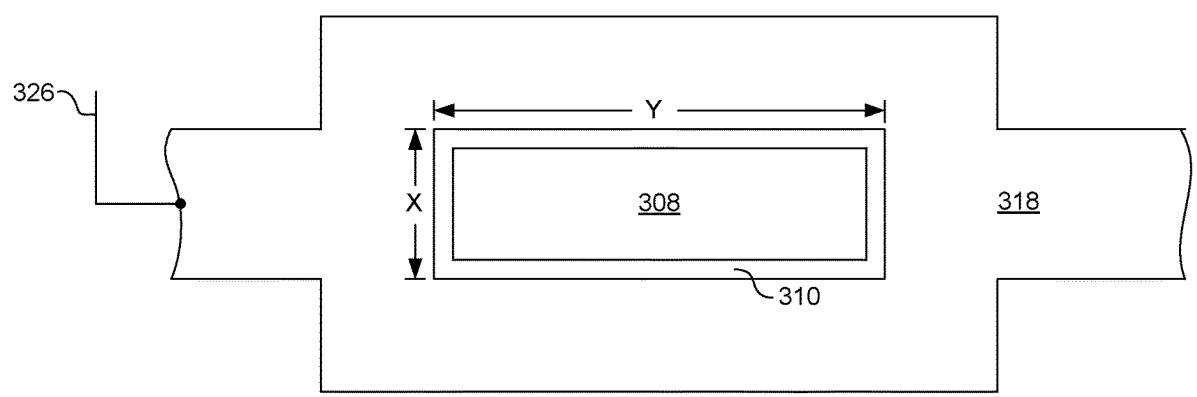
FIG. 4 is a cross top down view taken from line 4-4 of FIG. 3.

FIG. 4 shows a top-down, cross sectional e as seen from line 4-4 of FIG. 3. In FIG. 4, it can be seen that the semiconductor column is surrounded at its sides by the thin gate dielectric layer. Ifs addition, it can be seen that the electrically conductive gate/word-line line wraps around the semiconductor structure 308 and the thin gate dielectric layer 310. The electrically conductive gate/word-line also extends beyond the semiconductor 308 and gate dielectric 310 to connect with word-line circuitry 326.

With continued reference to FIG. 4, the semiconductor structure 308 has two main axes of symmetry "x" and "y" an a plane parallel with the surface of the substrate 312 (FIG. 3), and it can be seen that these axes x and y are unequal. In order to increase the drive current through the selector device 302, the longer dimension y can be increased while keeping the smaller x dimension constant. Increasing the y dimension increases the perimeter and area of the interface between the gate dielectric 310 and the semiconductor 308.

Figure 5C:
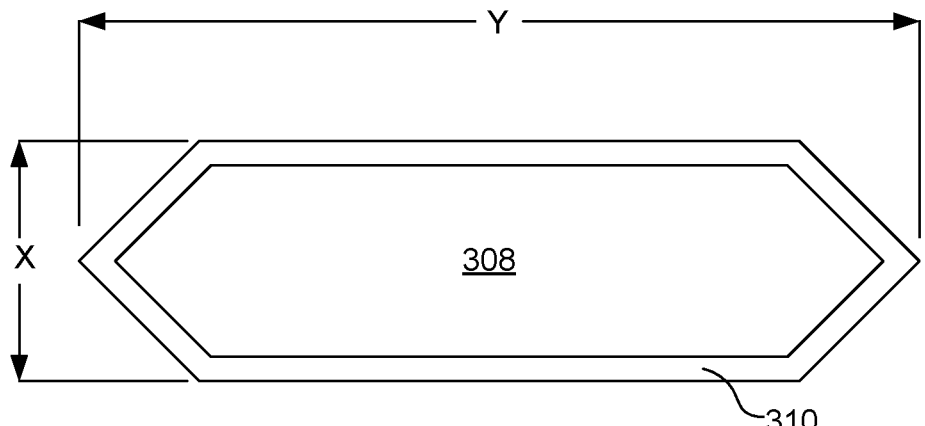
FIGS. 5a-5c are top down views of various configurations of a semiconductor structure surrounded by a gate dielectric layer according to various possible embodiments.
Figure 5B:
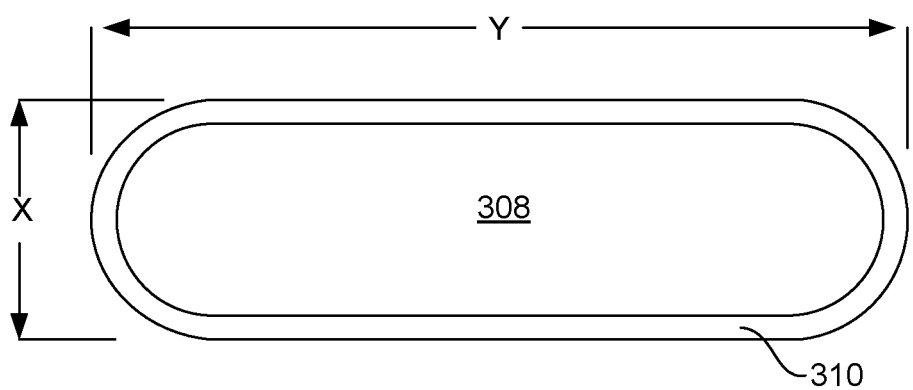
Figure 5A:
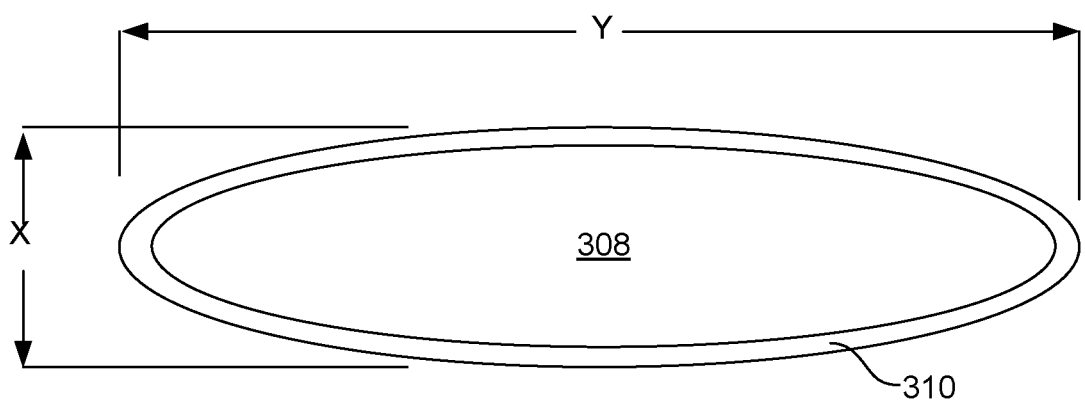

It should be pointed out that, while FIG. 4 shows the pillar structure having a cross-section parallel with the substrate 312 (FIG. 3) that is rectangular, this is by way of example of one possible embodiment. The semiconductor structure 308 could have a cross section that any of various other shapes having a dimension in a principle plane of symmetry in one direction that is greater than a dimension in a second, perpendicular principle plane of symmetry (both dimensions being in a plane parallel with the surface of the substrate 312). FIGS. 5a-5c show examples of various other shapes of a cross-sections of a semiconductor structure 308 in a plane parallel with the substrate 312 (FIG. 3). For example, FIG. 5a shows that the semiconductor structure 308 could have an elliptical cross-section. FIG. 5b shows that the semiconductor structure 308 could have a cross-section with an oval configuration, with straight parallel sides and a rounded end. FIG. 5c shows that the semiconductor structure 308 could have cross-section in the form of an elongated polygon. While 5c shows the semiconductor structure 308 as being an elongated hexagon, any other type of polygonal shape could be used as well.

Figure 6:
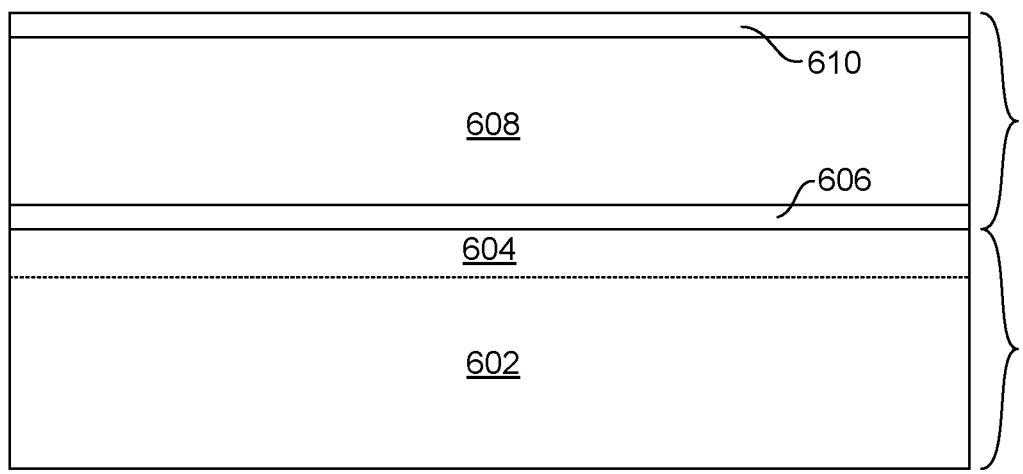
FIGS. 6-18 are views of a memory cell structure in various intermediate stages of manufacture according to an embodiment.

FIGS. 5-18 show a memory cell in various intermediate stages of manufacture in order to illustrate a method for manufacturing a memory cell or array of memory cells according to an embodiment. With particular reference to FIG. 6, a substrate 602 is provided. The substrate 602 can have an upper portion that is doped to form an electrically conductive source-line. The doped upper portion 604 of the substrate 602 can be divided into source diffusion channels (not shown) by forming trench isolation layers (also not shown). A first dielectric layer 606 is deposited over the upper portion 604 of the substrate 602. An electrically conductive gate/word-line layer 608 is then deposited over the first dielectric layer 606, and a second dielectric layer 610 is deposited over the electrically conductive gate/word-line 608. The first and second dielectric layers 606, 610 can be constructed of an oxide such as silicon oxide and the electrically conductive gate/word-line layer 608 can be constructed of polysilicon, metal or some other suitable, electrically conductive material.

Figure 7:
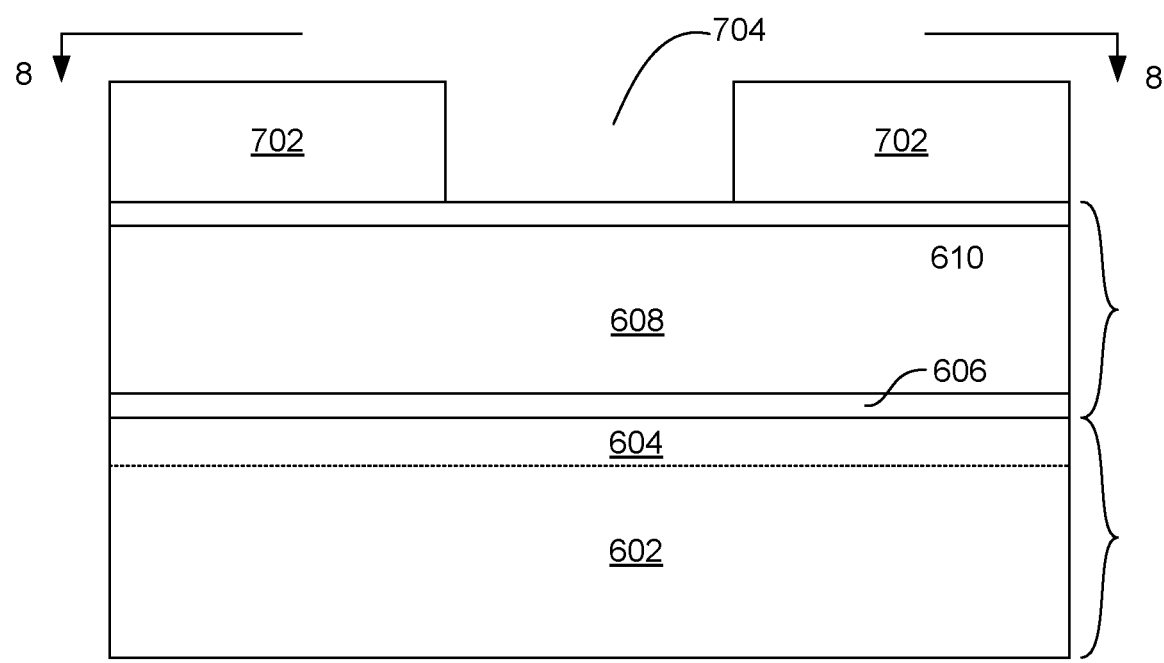
Figure 8:
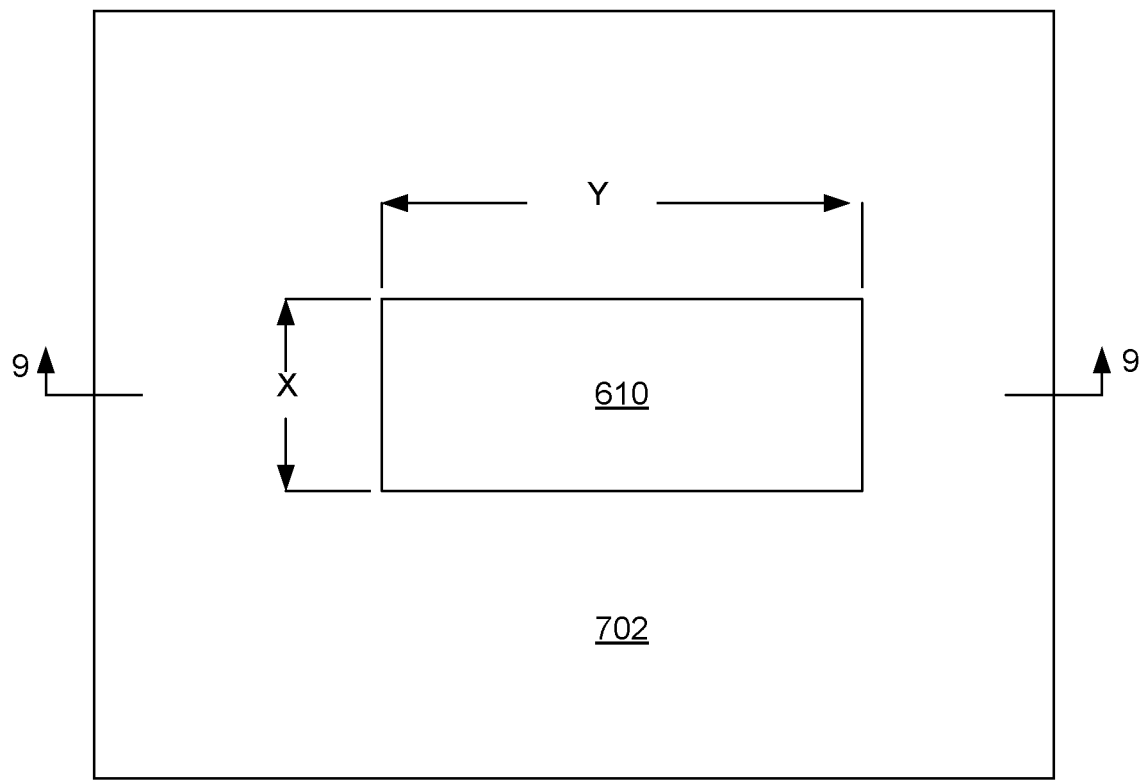

With reference now to FIG. 7, a mask structure 702 is formed over the layers 606, 608, 610. The mask 702 can include a photolithographically patterned photoresist and may include other layers as well, such as a hard mask, bottom antireflective coating, etc. The mask 702 has an opening 704 that can be seen more clearly with reference to FIG. 8 which shows a top down view as seen from line 8-8 of FIG. 7. As seen in FIG. 8, the mask opening 704 has a shape with two principle axes of symmetry in a plane that is parallel with the substrate 312 (FIG. 3). And, as discussed above, the two axes of symmetry have dimensions X and Y that are not equal to one another. As shown in FIG. 8 the Y axis is larger than the X axis. The length of the Y axis can be chosen to provide a desired amount of current drive in a finished memory cell. Also, as discussed above, while the opening 704 is shown in FIG. 8 as being rectangular it could any number of other shapes, such as but not limited the shapes described above with reference to FIGS. 5a-5c.

Figure 9:
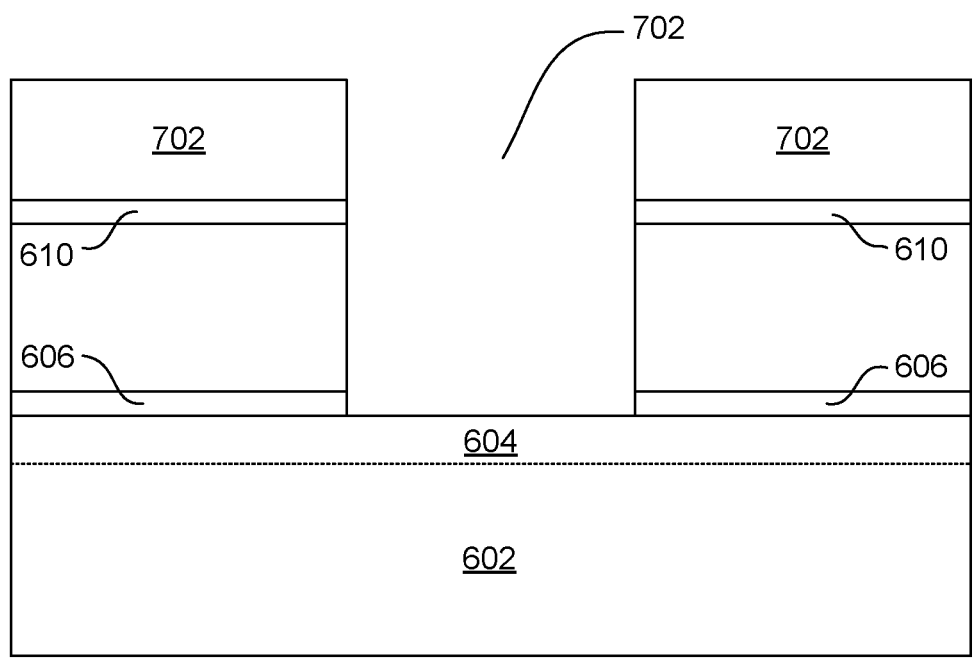
Figure 10:
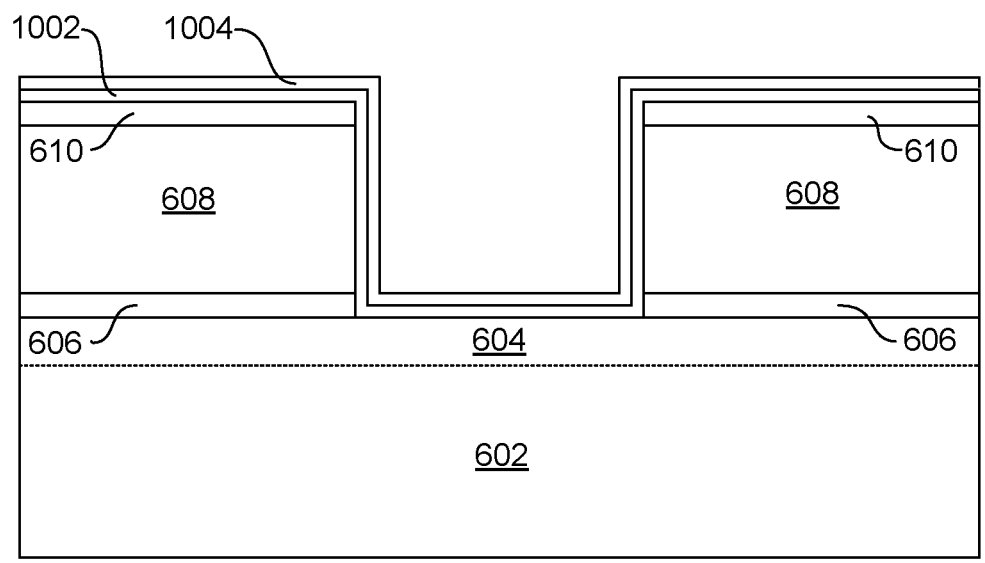

FIG. 9 is a cross-sectional view as seen from line 9-9 of FIG. 8. As shown in FIG. 9, an anisotropic material removal process such as ion milling or ion beam etching is performed to remove portions of layers 606, 608, 610 that are exposed through the opening 704 in the mask 706. This material removal process is performed until the upper portion 604 of the substrate 602 has been reached. Then, with reference to FIG. 10, a thin gate dielectric layer 1002 is deposited. The gate dielectric layer 1002 can be an oxide such as silicon dioxide. A protective layer 1004 can be deposited over the gate dielectric layer 1002. The protective layer 1004 can be a material such as amorphous silicon.

Figure 11:
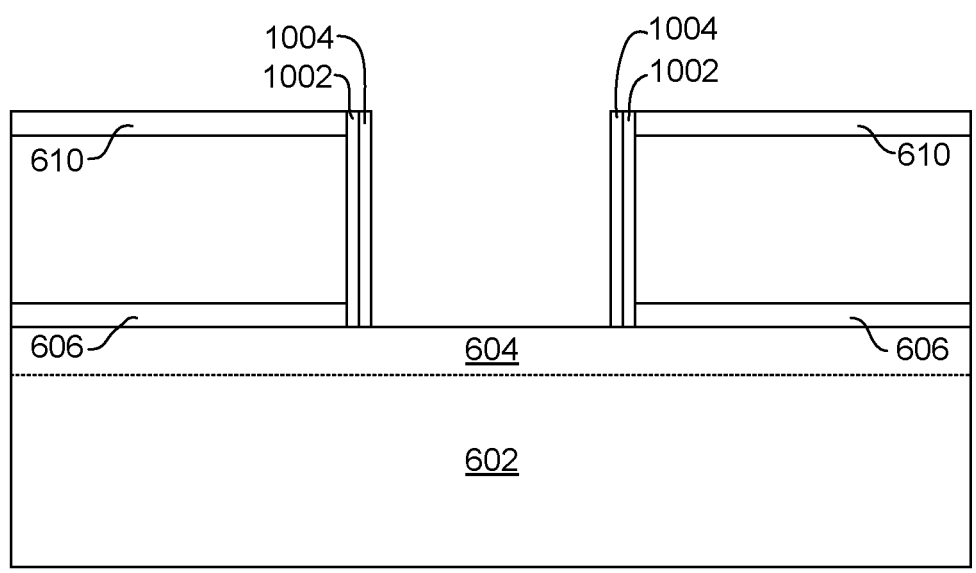
Figure 12:
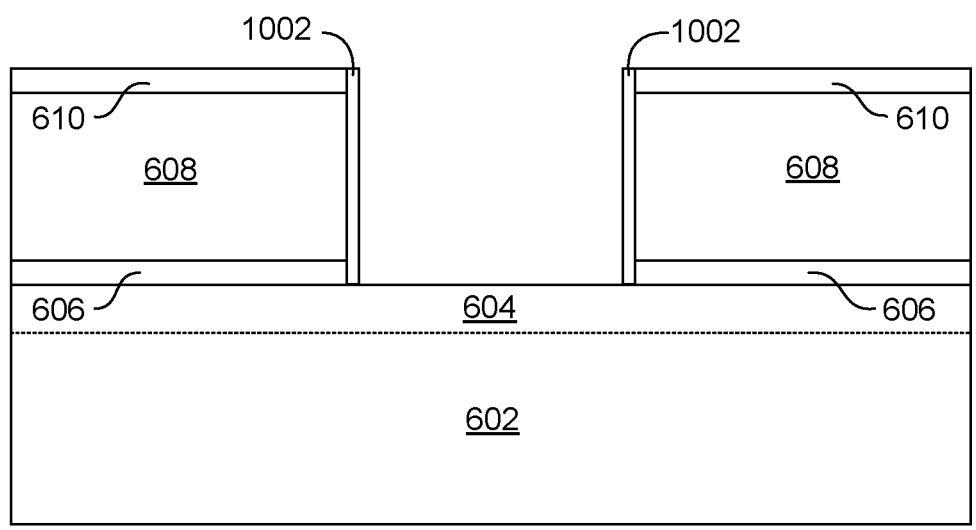

With reference now to FIG. 11, an anisotropic material removal process such as ion milling or ion beam etching is performed to remove horizontally disposed portions of the layers 1002, 1004, leaving a structure as seen in FIG. 11, with layers 1002, 1004 remaining as side wall structures on the sides of the opening formed in the layers 606, 608, 610. Then, a highly selective process is used to remove the remaining protective layer 1004 on the side wall of the structure. This can be performed, for example, using HCL, vapor at 900 degrees C. This leaves a sidewall of gate dielectric material 1002 on the sides of the opening formed in the layers 606, 608, 610.

Figure 13:
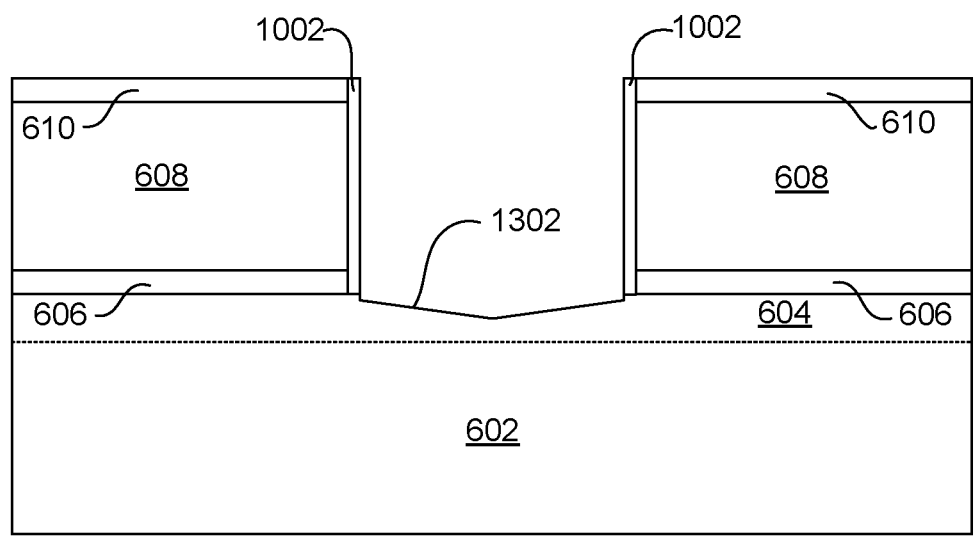

With reference now to FIG. 13, an etching process is performed to remove any native oxide from the exposed surface of the upper, doped portion 604 of the semiconductor substrate 602. This etching is performed until a crystalline, non-oxide semiconductor has been reached and is preferably performed so as to form a beveled surface 1302 as shown in FIG. 13.

Figure 14:
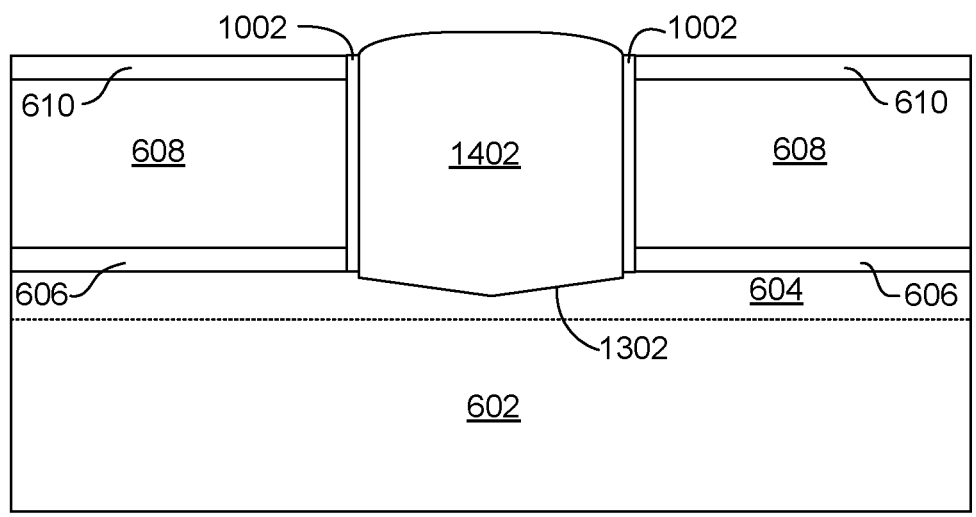

With reference now to FIG. 14, a semiconductor 1402 is grown on the etched surface 1302. The semiconductor material 1402 can be Si, Site. InGaAs, etc. The semiconductor 1402 is grown by selective epitaxial growth, wherein crystalline semiconductor material 1402 grows only on the exposed, etched monocrystalline surface 1302. This selective epitaxial growth causes the semiconductor material 1402 to grow with a monocrystalline or nearly monocrystalline structure. This crystal structure results in excellent electrical conduction in a finished selector device allowing for high current flow to a memory element in a memory cell structure. While a perfectly monocrystalline structure in the material 1402 may not actually be achieved, this process results in a structure that is as close to monocrystalline as possible. For example, the semiconductor structure 1402 can be at least 80 percent monocrystalline by volume or more preferably at least 90 percent monocrystalline by volume. In addition, the previously described beveled surface 1302 has been found to result in further improved monocrystalline structure in the epitaxially grown semiconductor 1402. The selective epitaxial growth can be performed in a reduced pressure chemical vapor deposition system.

Figure 15:
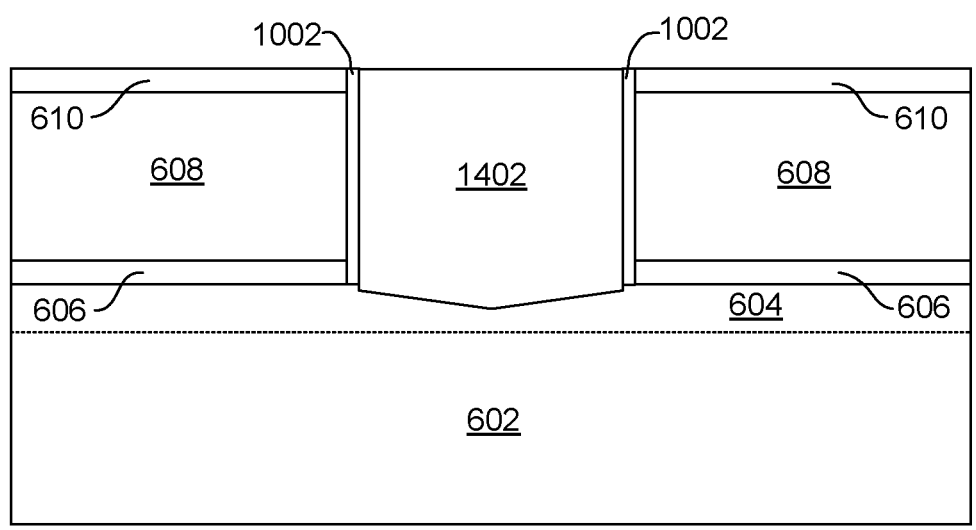

The epitaxial growth of the semiconductor material 1402 can be performed until the semiconductor actually extends beyond the opening in the layers 606, 608, 610 as shown in FIG. 14. A chemical mechanical polishing process can be performed to planarize the semiconductor layer 1402, resulting in a structure as shown in FIG. 15. The above processes result in a novel selector structure that is well suited for delivering a desired drive current to a memory element in a memory cell.

Figure 16:
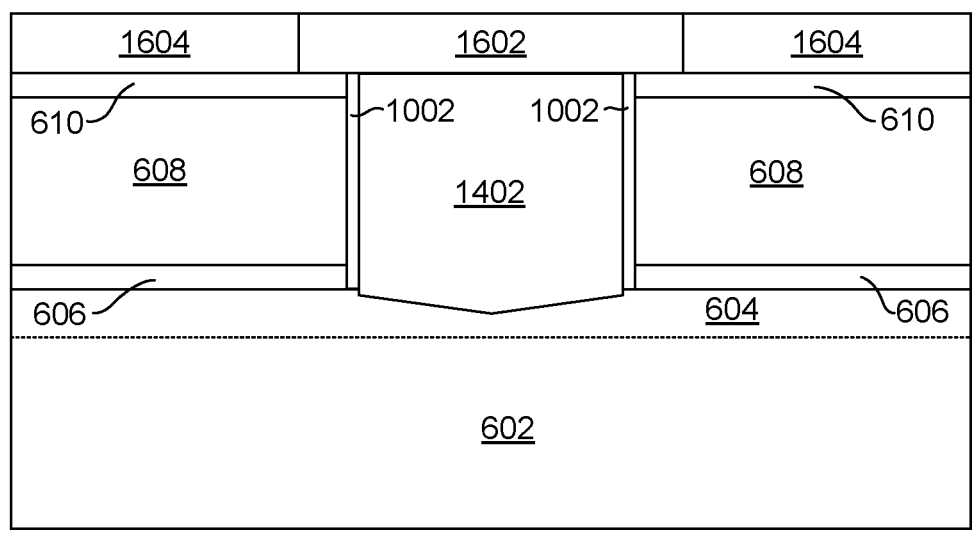

With reference now to FIG. 16, a first electrode structure 1602 is formed over and electrically connected with the semiconductor column structure 1402. The electrode can be surrounded by a layer of dielectric material 1604. The dielectric layer 1604 can be an oxide such as silicon dioxide. In addition to the electrode 1602, other electrically conductive structures such as an electrically conductive metal via (not shown), may be formed between the electrode and the semiconductor structure 1402 to electrically connect the electrode 1602 with the semiconductor structure 1402.

Figure 17:
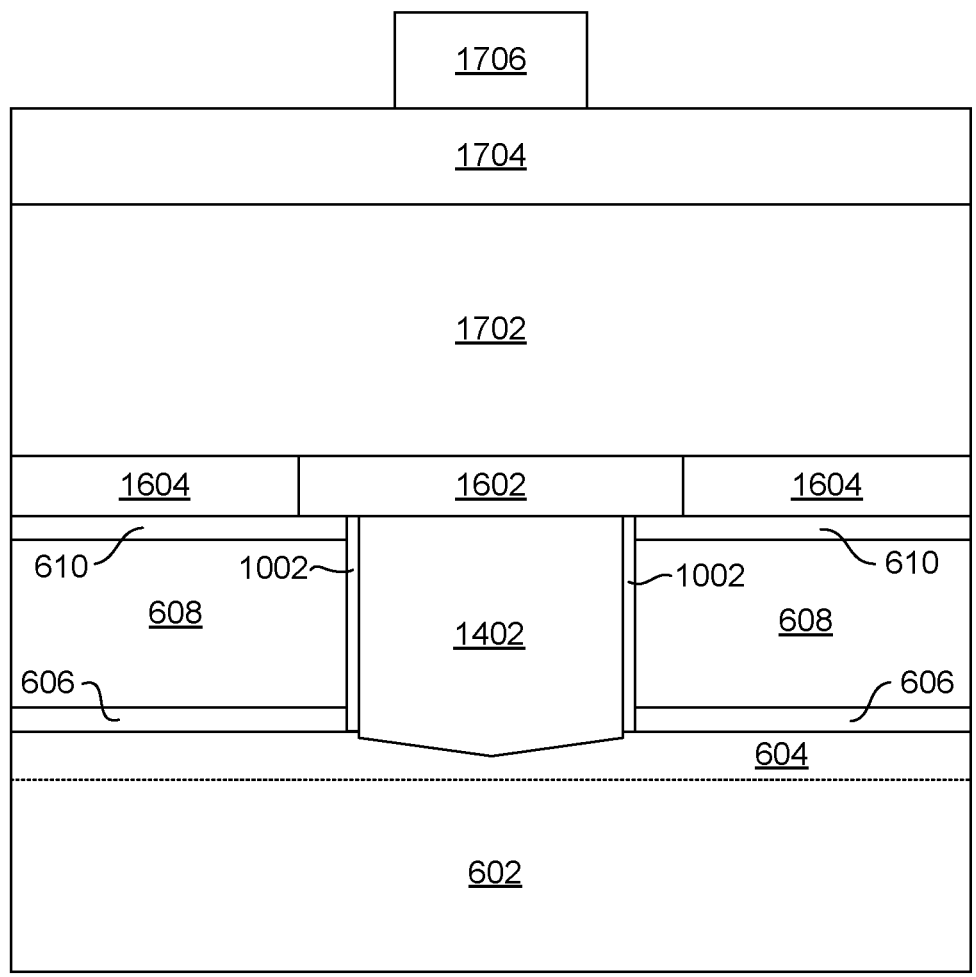
Figure 18:
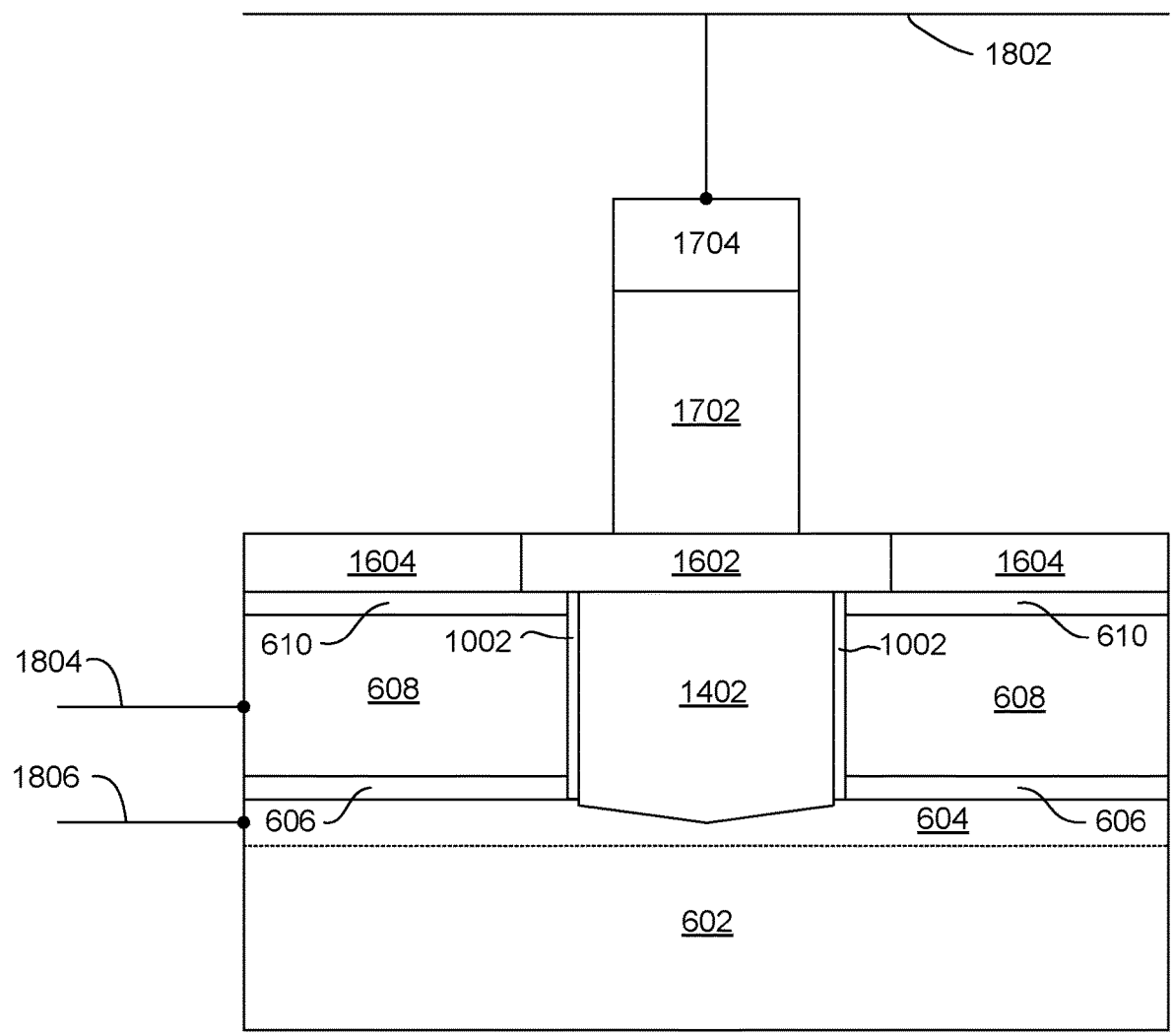

With reference now to FIG. 17, a layer or series of layers chosen to construct a two terminal memory element are deposited. For example, if a perpendicular magnetic tunnel junction element (pMTJ) is to be used as a two terminal memory element, then the layers 1702 could include various layers such as those making up a magnetic tunnel junction element such as the memory element 100 described above with reference to FIG. 1. An electrically conductive second electrode layer 1704 can be formed over the memory element layer or layers 1702, and a mask structure 1706 is formed over the layers 1702, 1704. Then, an anisotropic material removal process such as ion milling or ion beam etching can be performed to remove portions of the layers 1702, 1704 that are not protected by the mask 1706. The mask can then be removed, leaving a structure as shown in FIG. 18. The upper electrode 1706 can be electrically connected with bit-line circuitry 1802. The electrically conductive gate/word-line 608 can be electrically connected with word-line circuitry 1804, and the doped upper portion 604 of the substrate 602 can be electrically connected with source-line circuitry 1806.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A memory cell structure including a selector transistor having a three-dimensional transistor structure coupled to a memory element, the memory cell structure comprising:
   a two-terminal resistive memory element having a first electrode and a second electrode, wherein an electrical current flowing between the first electrode to the second electrode switches the memory state of the memory element;
   the selector transistor having a first electrode coupled to the first electrode of the memory element, a second electrode coupled to receive a source-line voltage and a control terminal coupled to receive a gate voltage, wherein the selector transistor comprises:
   a semiconductor substrate having a surface;
   a semiconductor pillar structure formed on the semiconductor substrate and being integral to the selector transistor, the semiconductor pillar having a first dimension parallel with the surface of the semiconductor substrate and a second dimension parallel with the semiconductor substrate and perpendicular to the first dimension, wherein the first and second dimensions are unequal with one another, wherein the semiconductor pillar structure includes a first doped region forming the first electrode and a second doped region forming the second electrode of the selector transistor;
   a gate dielectric layer surrounding the semiconductor pillar structure; and
   an electrically conductive gate structure surrounding the semiconductor pillar structure and the gate dielectric layer and forming the control terminal of the selector transistor,
   wherein the selector transistor provides a drive current flowing between the first and second electrodes of the selector transistor as a function of the gate voltage received at the control terminal, the drive current having a magnitude being a function of the larger of the first or second dimension of the semiconductor pillar structure of the selector transistor, the drive current being provided to the memory element as the electrical current to switch the memory state of the memory element.

2. The memory cell structure as in claim 1, wherein the semiconductor pillar structure is formed by selective epitaxial growth on the semiconductor substrate.

3. The memory cell structure as in claim 1, wherein the semiconductor pillar structure is substantially mono-crystalline.

4. The memory cell structure as in claim 1, wherein the semiconductor pillar structure is at least 80 percent monocrystalline by volume.

5. The memory cell structure as in claim 1, wherein the semiconductor pillar structure is at least 90 percent monocrystalline by volume.

6. The memory cell structure as in claim 1, wherein the semiconductor pillar structure has a cross-section parallel with the semiconductor substrate that is rectangular.

7. The memory cell structure as in claim 1, wherein the semiconductor pillar structure has a cross-section parallel with the semiconductor substrate that is oval.

8. The memory cell structure as in claim 1, wherein the semiconductor pillar structure has a cross-section parallel with the semiconductor substrate that is elliptical.

9. The memory cell structure as in claim 1, wherein the semiconductor pillar structure has a cross-section parallel with the semiconductor substrate that is an elongated polygon.

10. A memory device, comprising:
    a selector transistor having a first electrode, a second electrode and a control terminal, the second electrode being coupled to receive a source-line voltage and the control terminal being coupled to receive a gate voltage, wherein the selector transistor comprises:
    a semiconductor substrate having a surface;
    a semiconductor pillar structure formed on the semiconductor substrate and being integral to the selector transistor, the semiconductor pillar having a first dimension parallel with the surface of the semiconductor substrate and a second dimension parallel with the semiconductor substrate and perpendicular to the first dimension, wherein the first and second dimensions are unequal with one another, wherein the semiconductor pillar structure includes a first doped region forming the first electrode and a second doped region forming the second electrode;
    a gate dielectric layer surrounding the semiconductor pillar structure;
    an electrically conductive gate structure surrounding the semiconductor pillar structure and the gate dielectric layer and forming the control terminal; and
    a magnetic tunnel junction (MTJ) memory element having a first electrode and a second electrode, the first electrode being electrically connected to the first electrode of the semiconductor pillar structure of the selector transistor, wherein the selector transistor provides a drive current flowing between the first and second electrodes of the selector transistor as a function of the gate voltage received at the control terminal, the drive current having a magnitude being a function of the larger of the first or second dimension of the semiconductor pillar structure of the selector transistor, the drive current being provided to the MTJ memory element as a drive current to switch a magnetic orientation of a magnetic free layer of the MTJ memory element.

11. The memory device as in claim 10, further comprising an electrically conductive electrode disposed between and electrically connecting the first electrode of the MTJ memory element and the first electrode of the semiconductor pillar structure.

12. The memory device as in claim 10, wherein the semiconductor pillar structure is epitaxially grown on the surface of the semiconductor substrate.

13. The memory device as in claim 10, wherein the semiconductor pillar structure is substantially mono-crystalline.

14. The memory device as in claim 10, wherein the semiconductor pillar structure is at least 80 percent monocrystalline by volume.

15. The memory device as in claim 10, wherein the semiconductor pillar structure is at least 90 percent monocrystalline by volume.

16. The memory device as in claim 10, wherein the semiconductor pillar structure has a cross-section parallel with the semiconductor substrate that is rectangular.

17. The memory device as in claim 10, wherein the semiconductor pillar structure has a cross-section parallel with the semiconductor substrate that is oval.

18. The memory device as in claim 10, wherein the semiconductor pillar structure has a cross-section parallel with the semiconductor substrate that is an elongated polygon.

19. The memory cell structure as in claim 1, wherein the memory element comprises one of a magnetic tunnel junction (MTJ) memory element, an ReRAM; a Correlated Electron RAM (CERAM), a Conductive Bridge RAM (CBRAM), a memristor structure, or a Phase Change Material (PCM).

* * * * *